United States Patent
Oertel et al.

(10) Patent No.: US 6,737,872 B2
(45) Date of Patent: May 18, 2004

(54) PROCEDURE AND DEVICE FOR THE EVALUATION OF THE QUALITY OF A CABLE

(75) Inventors: Eberhard Oertel, Dresden (DE); Gerhard Jung, Dresden (DE)

(73) Assignee: Hagenuk KMT Kabelmesstechnik GmbH, Sunnyvale, CA (US)

( * ) Notice: Subject to any disclaimer, the term of this patent is extended or adjusted under 35 U.S.C. 154(b) by 0 days.

(21) Appl. No.: 09/957,819

(22) Filed: Sep. 20, 2001

(65) Prior Publication Data

US 2002/0041187 A1 Apr. 11, 2002

(30) Foreign Application Priority Data

Sep. 22, 2000 (DE) .......................... 100 47 548

(51) Int. Cl.[7] .................. H01H 31/02; H01H 31/12; H04B 3/46
(52) U.S. Cl. ................. 324/543; 324/539; 324/551
(58) Field of Search ............... 324/543, 551, 324/539, 72, 72.5

(56) References Cited

U.S. PATENT DOCUMENTS

| | | | | |
|---|---|---|---|---|
| 3,678,376 A | * | 7/1972 | Jaster et al. ........... | 324/551 |
| 4,301,399 A | * | 11/1981 | Miller et al. .......... | 324/541 |
| 4,835,479 A | * | 5/1989 | Haines ................. | 324/540 |
| 4,866,392 A | * | 9/1989 | Lefeldt ................ | 324/541 |
| 4,980,645 A | * | 12/1990 | Soma et al. ........... | 324/541 |
| 5,276,401 A | * | 1/1994 | Soma et al. ........... | 324/551 |
| 5,448,176 A | * | 9/1995 | Mashikian et al. ..... | 324/551 |
| 5,714,885 A | | 2/1998 | Lulham ................ | 324/529 |
| 5,828,219 A | | 10/1998 | Hanlon et al. ......... | 324/429 |
| 6,208,149 B1 | * | 3/2001 | Aynvarg et al. ....... | 324/551 |

FOREIGN PATENT DOCUMENTS

| | | |
|---|---|---|
| DE | 19824157 C1 | 3/2000 |
| EP | 0825456 | 11/2003 |
| JP | 56004066 A * | 1/1981 ........ G01R/31/12 |

* cited by examiner

Primary Examiner—N. Le
Assistant Examiner—John Teresinski
(74) Attorney, Agent, or Firm—Finnegan, Henderson, Farabow, Garrett & Dunner, LLP

(57) ABSTRACT

A procedure and a system for the evaluation of the quality and/or efficiency of a cable or a cable segment by a current measurement is disclosed. This is achieved by supplying between the core and the screen of a cable a voltage with alternating polarity and rectangular shape. The periodic duration' of this voltage is selected in a way so as to permit the current measurement of the charge current shortly before a polarity reversal, providing a current value equal to the leakage current.

20 Claims, 3 Drawing Sheets

PROCEDURE AND DEVICE FOR THE EVALUATION OF THE QUALITY OF A CABLE

RELATED APPLICATIONS

This application claims priority to German application DE 100 47 548.5, filed on Sep. 22, 2000.

BACKGROUND

1. Field of the Invention

This invention concerns a procedure for the evaluation of the quality and/or the efficiency of a cable in a cable installation by a current measurement of a leakage current as a parasitic cross current.

2. Discussion of Related Art

It is known, that the parasitic cross current flows as a leakage current between a current carrying conductor at the core of a cable and the cable screen or concentric, which is generally an earth-ground potential. This current reduces the efficiency and/or the Quality of the transmission. By the measurement of this leakage current, the quality of the cable can be determined, additionally a corresponding test criteria can be established. The higher the leakage current, the lower is the quality of the cable.

For the evaluation of the leakage current, it was recommended to connect a DC voltage between the core and the screen of the cable and to measure the resulting flow of the current. For this purpose the cable is disconnected from the net and tested with a DC voltage equivalent to the operating voltage level. The leakage current is measured via a connected current meter. The disadvantage of this procedure is the generation of polarisation effects in the dielectric of the cable insulation resulting in a possible pre-damaging of the cable.

Further known methods are the so called VLF (very low frequency) Test methods. For this method, an alternating voltage with a very low frequency, for example 0.1 Hz is applied. The rising/falling slope of this frequency is in the frequency spectrum of 50 Hz. Significant disadvantages of this technology are interferences of compensation losses and leakage current which prevent a stable and continuous measurement of the leakage current.

Further known technologies as resonance testing have the same disadvantage, that the continuous measurement of the leakage current is not possible. This is a result of continuous re-charging procedures that prevent a stable situation in the cable.

SUMMARY

The task of the invention is therefore to provide a procedure and a device of the previously described type, which provides a significantly more reliable evaluation of the quality and/or efficiency of a cable or cable section than previously proposed systems.

A procedure for the evaluation of the quality and/or the efficiency of a cable or a cable segment in accordance with the present invention includes a current measurement of a leakage current indicating the parasitic cross current. This measurement is achieved by supplying between two conductors for example the core and a screen or two cores of a cable, a voltage ($V_{VLF}$) with alternating polarity and rectangular shape. The periodic duration of the voltage ($V_{VLF}$) is selected in a way which permits the current measurement of the leakage current at a time shortly before a polarity reversal where the voltage change or rise is zero ($\Delta V=0$). The leakage current close to the polarity reversal is substantially the same as the parasitic cross current. In some embodiments, the current measurement of the leakage current is performed at a selected time period.

A device on which this procedure can be performed includes a VLF Generator for the generation of a VLF Voltage with changing polarity in substantially a rectangular shape. The VLF voltage is coupled to a cable to be tested and an Analyzing and Evaluation unit for the evaluation and visualization of a leakage current in the tested cable shortly before a polarity change of the VLF voltage.

Further details, characteristics and advantages can be deduced from the following description with respect to the following figures.

In the figures, elements designated with the same identification have the same function.

DETAILED DESCRIPTION

Figure 1:
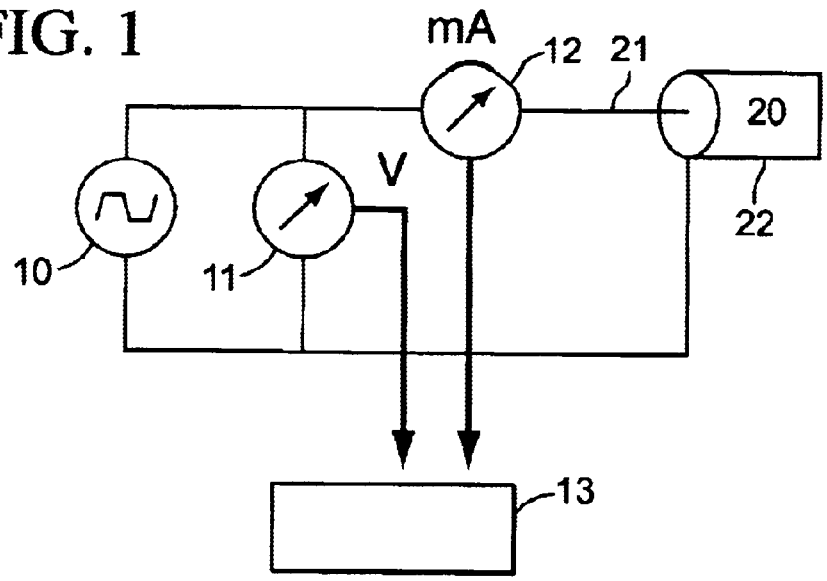
FIG. 1 shows a principle diagram of a measuring arrangement according to the present invention.

FIG. 1 is a block diagram of a measurement system according to the present invention. The measurement system of FIG. 1 includes a VLF Generator 10, a Voltage measuring device (Voltmeter) 11, a current measuring device (Amperemeter) 12, and an Analysis and Evaluation unit 13. The VLF Generator feeds a cable 20, where one pole is connected to a core 21 of cable 20 and the other pole is connected to a screen 22 of cable 20. Voltmeter 11 measures the voltage at the VLF generator, and resultingly between core 21 and screen 22 of cable 20. Amperemeter 12 measures the current flowing into the core 21. The measured voltage and current values are supplied to the Analysis and Evaluation unit 13.

Figure 3:
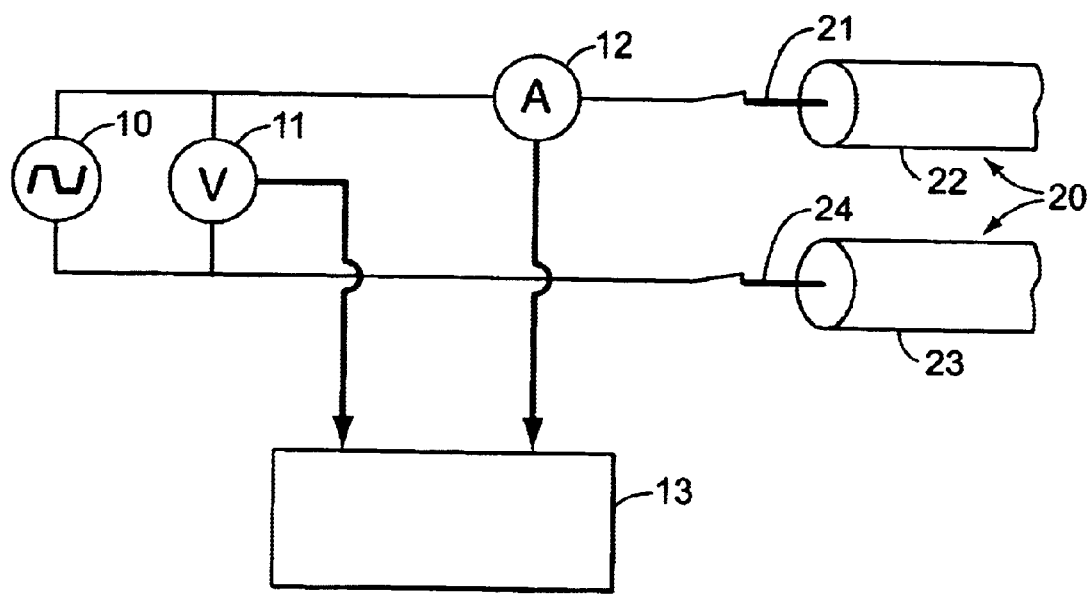
FIG. 3 shows a measurement of parasitic current between central conductors of adjacent cables.

Although FIG. 1 shows generator 10 coupled between core 21 and sheath 22 of cable 20, a parasitic current between adjacent cores 21 and 24 in cable 20 can also be measured. FIG. 3 shows a measurement system according to the present invention for measuring the parasitic current between adjacent cores 21 and 24 in cable 20 in the same fashion as the parasitic current between the inner conductor and outer sheath or soil ground is measured shown in FIG. 1.

Figure 2A:
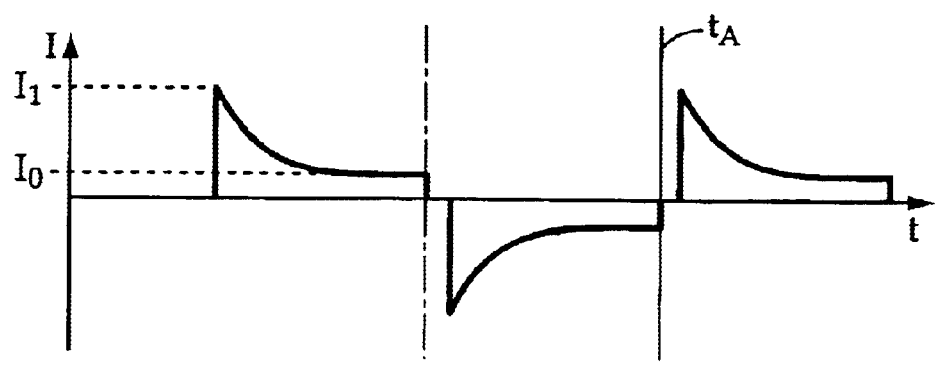
FIGS. 2a and 2b show current and voltage diagrams of the measuring arrangement shown in FIG. 1.
Figure 2B:
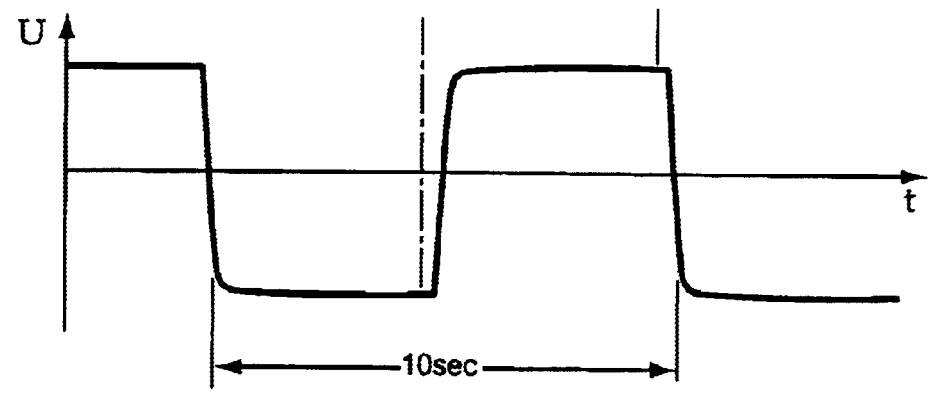

The shape of the voltage generated by VLF Generator 10 is shown in FIG. 2b. FIG. 2b shows a square wave voltage, or a shaped cosine square wave. The shape of the according resulting current from this voltage, flowing into core 21 of cable 20, is shown in FIG. 2a. As shown in FIG. 2a, the current I rises with a polarity change of the VLF voltage from positive to negative potential to a maximum cable charge current $i_1$ and decreases following down to a leakage current $I_0$ before the next polarity change. The next polarity change, which will be in the reverse direction, results in the corresponding response from the current into negative polarity.

For the VLF Test, the leakage current is equal to the compensation current, which is supplied in the cable 20 by the VLF Generator 10, shortly before the next polarity change (recharging process).

Analysis and Evaluation unit 13 receives and stores the actual measured value $I_0$ at a moment when the VLF voltage is stable ($\Delta V=0$). This condition is shortly before the next polarity change and represents a condition where the measured value of the current is equal to the leakage current of cable 20. In FIG. 2a this moment is indicated with the notation $t_A$. The leakage current is measured and indicated selectively at a specific point and displayed over a long duration. By the constant change of the polarity of the VLF Voltage connected to the cable, a damage of the dielectric of the cable insulation is unlikely.

Figure 4:
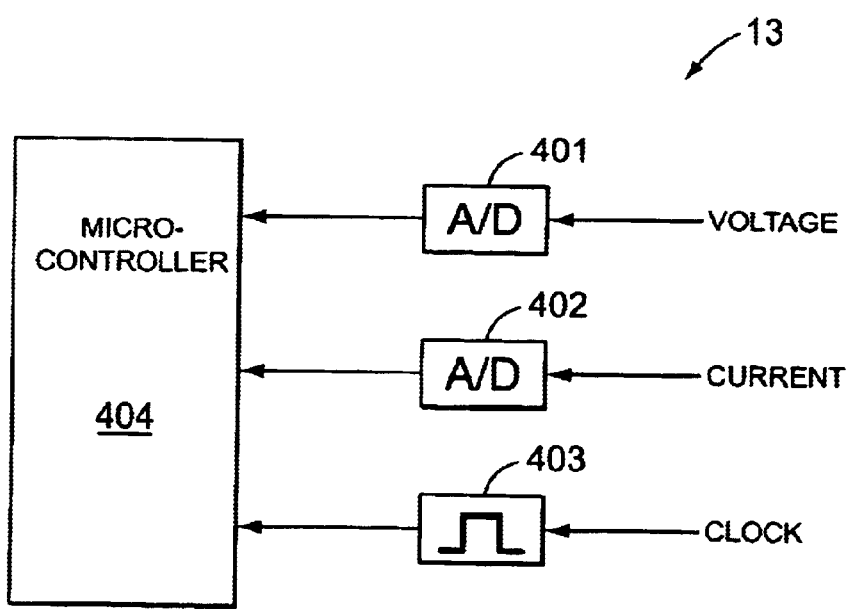
FIG. 4 shows an embodiment of the analysis and evaluation unit of FIGS. 1 and 3.

A block diagram of an embodiment of analysis and evaluation unit 13 is shown in FIG. 4. Analysis and evaluation unit 13 of FIG. 4 includes microcontroller 404 coupled to analog-to-digital converters 401 and 402 and a clock 403. In some embodiments, analysis and evaluation unit 13 can be an electronic circuit not including a microcontroller or microprocessor.

Analog-to-digital converter 401 receives and digitizes a voltage signal from voltmeter 11. Analog-to-digital converter 402 receives and digitizes a current signal from current meter 12. Analysis and display of the leakage current in cable 21 is performed in microcontroller 404.

Figures 5A, 5B:
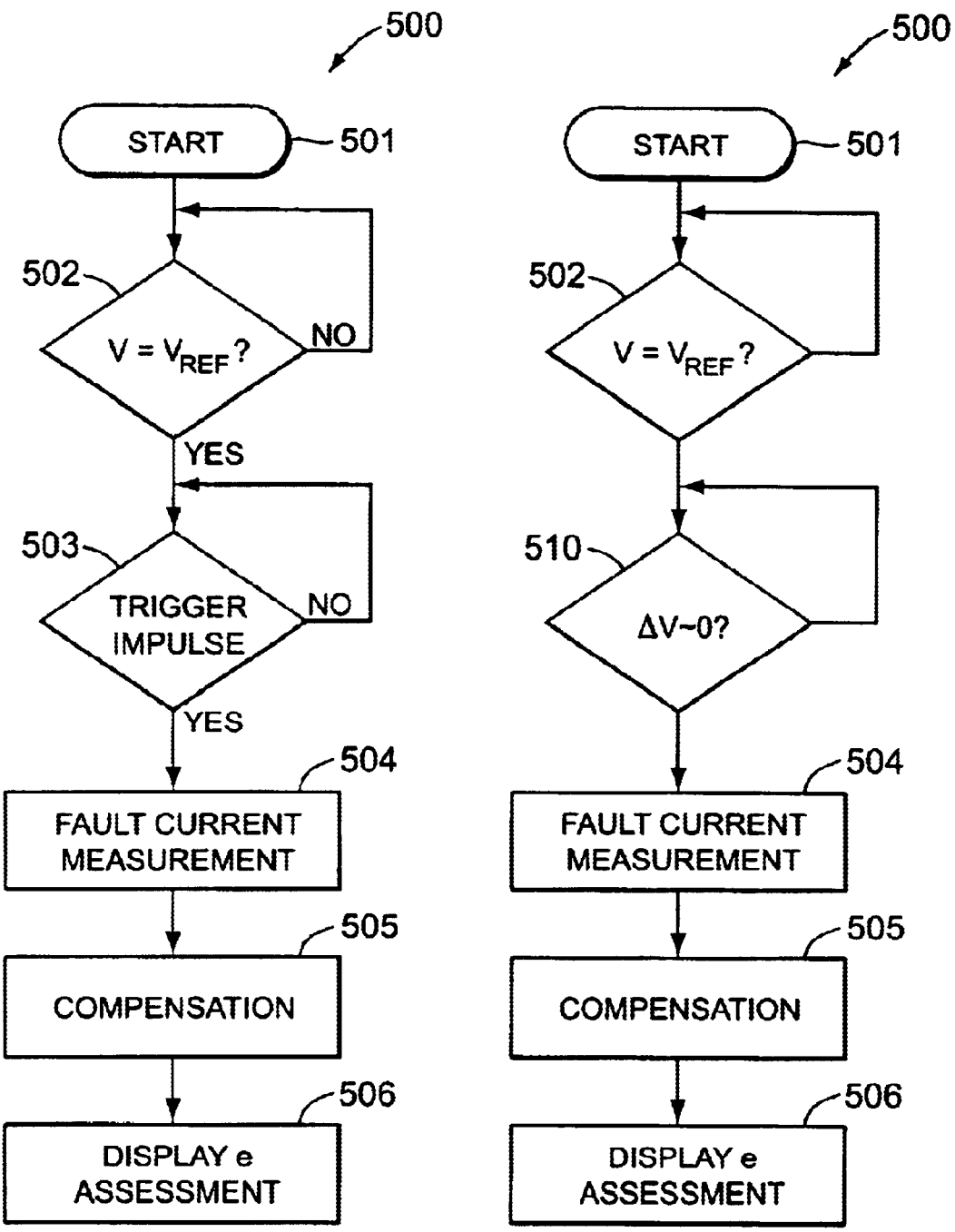
FIGS. 5A and 5B show embodiments of an algorithm executed on the analysis and evaluation unit of FIG. 4.

FIGS. 5A and 5B show embodiments of algorithm 500 which can be performed on microcontroller 404 according to the present invention. Algorithm 500 shown in FIG. 5A starts in start block 501. In block 502, the voltage from voltmeter 11 is checked to be sure that it is substantially a reference voltage (e.g., within about 10%). Algorithm 500 waits until the condition of block 502 is met. In block 503, algorithm 500 waits for a trigger impulse. The trigger impulse can be set at a time where the change in voltage will be approximately zero. In some embodiments, the trigger impulse is timed with the clock signal from clock 403. Algorithm 500 then waits until the trigger impulse is received.

In block 504, the current from amperemeter 12 is measured. In block 505, the current measured in block 504 is adjusted for normal charging of cable 20 or for current supplied by generator 10 that is not leakage current. In step 506, the results of the evaluation are displayed.

In algorithm 500 of FIG. 5B, condition block 503 of FIG. 5A is replaced with condition block 510 of FIG. 5B. Condition block 510 checks to see if the change in voltage is substantially zero, indicating that cable 20 is fully charged. In block 510, the change in voltage is measured and algorithm 500 waits until the change in voltage is approximately zero.

The above described embodiments of the invention are exemplary only. One skilled in the art may deduce various modifications to the embodiments described here which are intended to be within the scope of this invention. As such, the invention is limited only by the following claims.

We claim:

1. A method for the evaluation of the quality and/or efficiency of a cable or a cable segment, comprising:
   supplying a voltage having an alternating polarity and a rectangular shape in time between a first conductor and a second conductor;
   measuring a parasitic cross current between the first conductor and the second conductor at a time just prior to a polarity change in the voltage;
   determining the quality and/or efficiency of the cable from the parasitic cross current.

2. The method of claim 1, wherein the time just prior to the polarity change can be characterized as the time when the voltage is stable.

3. The method of claim 1, wherein measuring the parasitic cross-current includes measuring the parasitic current at a selected time.

4. The method of claim 1, wherein measuring the parasitic cross-current includes measuring the parasitic current at a time when a change in the voltage is low.

5. The method of claim 1, wherein the quality of the cable decreases with increasing values of the parasitic cross current.

6. The method of claim 1, wherein a period of the alternating polarity is sufficiently long to permit the voltage to stabilize and measurement of the parasitic cross current.

7. The method of claim 1, wherein the first conductor is a core and the second conductor is a sheath around the core.

8. The method of claim 1, wherein the cable includes at least two core conductors and the first conductor is a first core and the second conductor is a second core.

9. A measuring system, comprising:
   a voltage generator for generating a voltage with changing polarity in substantially a rectangular shape, the voltage generator being capable of being coupled between a first conductor and a second conductor of a test cable;
   an ampere meter coupled between the voltage generator and the first conductor;
   an analyzing and evaluation unit coupled to receive a current signal from the ampere meter, the analyzing and evaluation unit measuring the current signal just prior to a polarity change of the voltage and indicating a quality or efficiency value for the test cable.

10. The system of claim 9, further including a voltmeter coupled between the first conductor and the second conductor, the voltmeter providing a voltage measurement to the analyzing and evaluation unit.

11. The system of claim 9, wherein the analyzing and evaluation unit determines the current signal corresponding to the parasitic cross current when the voltage measurement from the voltmeter indicates a stable voltage.

12. The system of claim 11, wherein the stable voltage is correlates with a selected time of measurement.

13. The system of claim 11, wherein the stable voltage is determined by measuring the change in voltage.

14. The system of claim 9, wherein the first conductor is a core and the second conductor is a sheath of the test cable.

15. The system of claim 9, wherein the first conductor is a core and the second conductor is a second core of the test cable.

16. A measuring system, comprising:
   means for applying a substantially rectangular voltage between a first conductor and a second conductor of a cable;
   means for measuring a parasitic current between the first conductor and the second conductor just prior to a change in polarity of the substantially rectangular voltage; and
   means for determining cable quality from the parasitic current.

17. The system of claim 16, wherein the first conductor is a core of the cable and the second conductor is a sheath of the cable.

18. The system of claim 16, wherein the first conductor is a core of the cable and the second conductor is a second core of the cable.

19. The system of claim 16, further including means for monitoring the voltage between the first conductor and the second conductor.

20. The system of claim 16, further including means for determining a stable voltage between the first conductor and the second conductor.

* * * * *